United States Patent
Chang

(10) Patent No.: US 8,642,388 B2
(45) Date of Patent: Feb. 4, 2014

(54) METHOD FOR MANUFACTURING LIGHT EMITTING DIODES INCLUDING FORMING CIRCUIT STRUCTURES WITH A CONNECTING SECTION

(75) Inventor: Chao-Hsiung Chang, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/332,380

(22) Filed: Dec. 21, 2011

(65) Prior Publication Data

US 2012/0273829 A1 Nov. 1, 2012

(30) Foreign Application Priority Data

Apr. 26, 2011 (CN) .......................... 2011 1 0104678

(51) Int. Cl.
| | |
|---|---|
| *H01L 21/00* | (2006.01) |
| *H01L 33/00* | (2010.01) |
| *H01L 23/22* | (2006.01) |
| *H01L 23/24* | (2006.01) |
| *H01L 23/52* | (2006.01) |
| *H01L 23/12* | (2006.01) |

(52) U.S. Cl.
USPC .............. 438/113; 438/26; 438/27; 438/28; 438/33; 438/42; 438/110; 438/112; 438/121; 438/124; 438/125; 438/126; 438/127; 257/99; 257/100; 257/687; 257/690; 257/701; 257/E33.066; 257/E33.059

(58) Field of Classification Search
USPC ............ 257/99, E33.066, E33.059, 100, 687, 257/690, 701; 438/26–28, 42, 33, 110, 112, 438/113, 121, 124–127
See application file for complete search history.

(56) References Cited

U.S. PATENT DOCUMENTS

| 6,383,835 B1 * | 5/2002 | Hata et al. ....................... 438/65 |
| 7,358,154 B2 * | 4/2008 | Poo et al. ....................... 438/462 |
| 2002/0076914 A1 * | 6/2002 | Collins .......................... 438/617 |
| 2005/0186791 A1 * | 8/2005 | Hiatt ............................ 438/667 |
| 2010/0084675 A1 * | 4/2010 | Ueno et al. ...................... 257/98 |

* cited by examiner

*Primary Examiner* — Michael Jung
*Assistant Examiner* — Jay C Chang
(74) *Attorney, Agent, or Firm* — Altis Law Group, Inc.

(57) ABSTRACT

A method for manufacturing LEDs includes following steps: forming circuit structures on a substrate, each circuit structure having a first metal layer and a second metal layer formed on opposite surfaces of the substrate and a connecting section interconnecting the first and second metal layers; cutting through each circuit structure along a middle of the connecting section to form first and second electrical connecting portions insulated from each other via a gap therebetween; arranging LED chips on the substrate and electrically connecting the LED chips to the first and second electrical connecting portions; forming an encapsulation on the substrate to cover the LED chips; and cutting through the substrate and the encapsulation between the first and second electrical connecting portions of neighboring circuit structures to obtain the LEDs.

11 Claims, 9 Drawing Sheets

METHOD FOR MANUFACTURING LIGHT EMITTING DIODES INCLUDING FORMING CIRCUIT STRUCTURES WITH A CONNECTING SECTION

BACKGROUND

1. Technical Field

The present disclosure relates to a method for manufacturing semiconductor lighting devices, and particularly, to a method for manufacturing light emitting diodes. The present disclosure also relates to light emitting diodes obtained by the method.

2. Description of Related Art

Light emitting diodes (LEDs) have many beneficial characteristics, including low electrical power consumption, low heat generation, long lifetime, small volume, good impact resistance, fast response and excellent stability.

In general, the LEDs are formed by dividing an LED wafer. The LED wafer includes a substrate, LED chips arranged on the substrate and an encapsulation covering the LED chips. An upper surface and a bottom surface of the substrate have metal electrodes formed thereon. In manufacture of the LEDs, the metal electrodes have to be etched to insulate from each other. In addition, a plurality of holes are defined in the substrate and filled with electrical conductive materials to electrically connect the metal electrodes on the upper surface and lower surface of the substrate. The process wastes a lot of time and the yielding rate of the LEDs is relatively low.

What is needed is a method for manufacturing LEDs which can ameliorate the problems of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of the present disclosure will now be described in detail below, with reference to the accompanying drawings.

Figure 1:
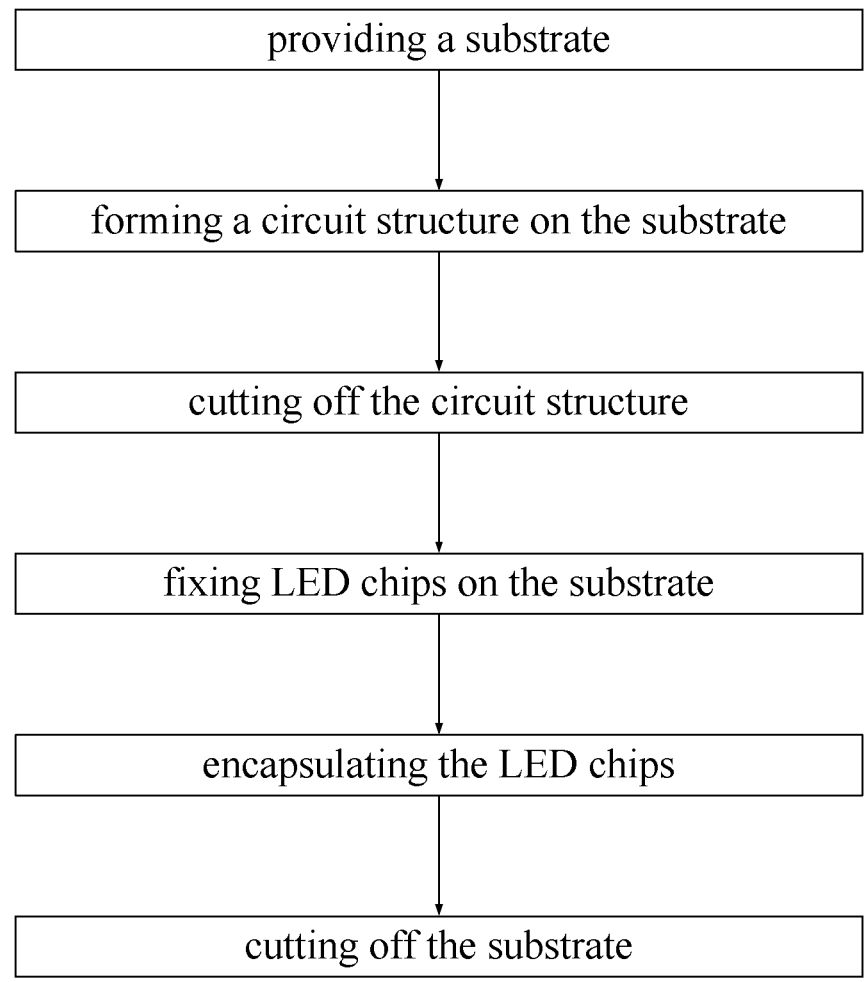
FIG. 1 is a flow chart of a method for manufacturing LEDs according to an exemplary embodiment of the present disclosure.

FIG. 1 shows a flow chart of a method for manufacturing an LED according to an exemplary embodiment of the present disclosure. The method for manufacturing the LED includes following steps: providing a substrate; forming a circuit structure on the substrate; cutting the circuit structure; fixing LED chips on the substrate; encapsulating the LED chips; and cutting the substrate. Details are given below.

Figure 2:
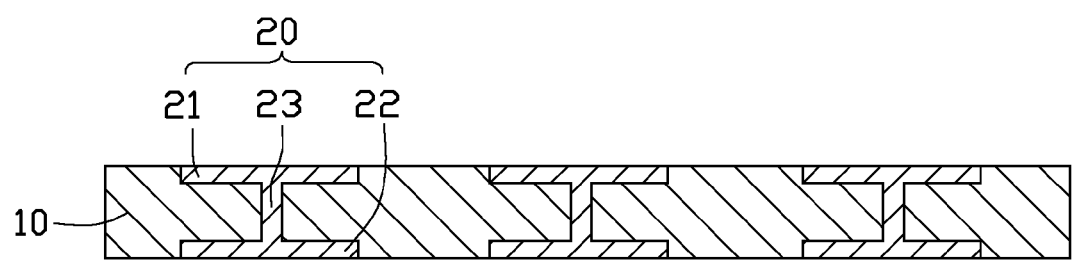
FIG. 2 is a cross sectional view showing a semi-finished product obtained from a first step and a second step of the method in FIG. 1.

Referring to FIG. 2, firstly, the substrate 10 is provided. The substrate 10 can be made of a material selected from a group consisting of sapphire, ZnO, silicate, and ceramic. In this embodiment, the substrate 10 has a plurality of concaves respectively formed in an upper surface and a bottom surface thereof. The concaves are in a uniform interval. A plurality of through holes extends through the substrate 10. Each through hole is aligned with and communicates with one concave in the upper surface (upper concave) and one concave in the bottom surface (bottom concave) of the substrate 10. The through hole and corresponding upper concave and bottom concave cooperatively form a receiving space.

Then, a plurality of circuit structures 20 are formed on the substrate 10 in a uniform interval. Each of the circuit structure 20 includes a first metal layer 21, a second metal layer 22 and a connecting section 23 interconnecting the first metal layer 21 with the second metal layer 22. The first metal layer 21 and the second metal layer 22 are arranged on the upper surface and the bottom surface of the substrate 10 respectively, and paralleled to and vertically aligned with each other. In this embodiment, each circuit structure 20 is filled on one receiving space, with the first metal layer 21 filled in the upper concave, the second metal layer 22 filled in the bottom concave, and the connecting section 23 filled in the through hole. An upper surface of the first metal layer 21 is coplanar with the upper surface of the substrate 10, and a bottom surface of the second metal layer 22 is coplanar with the bottom surface of the substrate 10. In this embodiment, the circuit structures 20 can be formed by insert molding technology. In an alternative embodiment, the circuit structures 20 can also be formed by sputtering, vacuum evaporating or electroplating. The circuit structure 20 can be made of a material selected from a group consisting of Al (aluminum), Cu (copper), and Ag (sliver).

Figure 3:
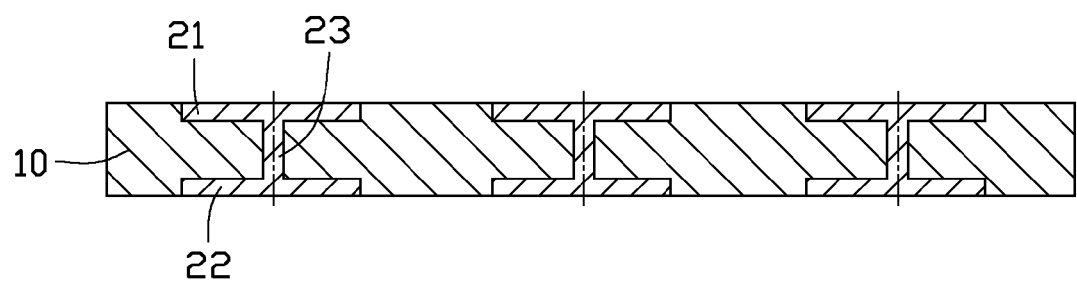
FIGS. 3-4 are views similar to FIG. 2, showing the semi-finished product obtained after a third step of the method in FIG. 1.
Figure 4:
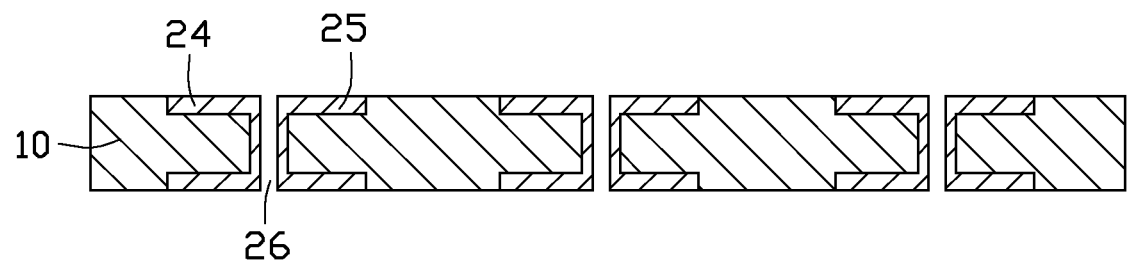

Then, referring to FIGS. 3-4, each of the circuit structures 20 is cut through along the connecting section 23, thereto form a first electrical connecting portion 24 and a second electrical connecting portion 25 insulated from each other. In addition the substrate 10 is separated into a plurality of parts. The first electrical connecting portion 24 and the second electrical connecting portion 25 each extend from the upper surface to the bottom surface of the substrate 10, thereto form a surface-mounting structure. A gap 26 is formed between adjacent first electrical connecting portion 24 and second electrical connecting portion 25. In this embodiment, a width of the gap 26 is not less than 0.1 mm. In addition, in forming the circuit structures 20, indentations (not shown) can previously be formed in the positions needed to be cut off. Cross sections of the indentations can be V-shaped, arch-shaped or square-shaped.

Figure 5:
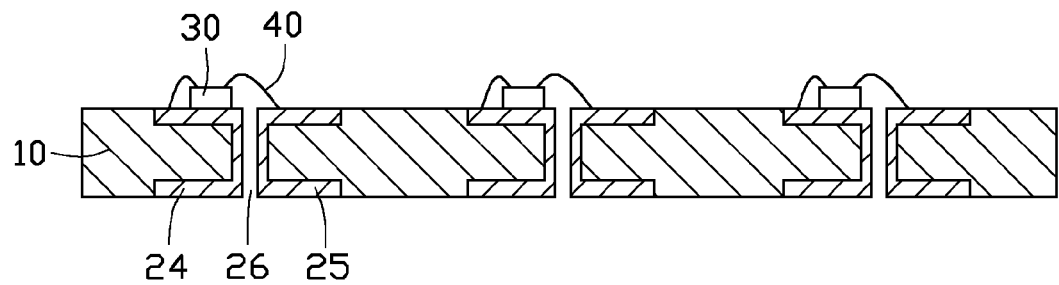
FIG. 5 is a view similar FIG. 2, showing the semi-finished product obtained after a fourth step of the method in FIG. 1.

Referring to FIG. 5, a plurality of LED chips 30 is formed on the substrate 10, and particularly on the upper surfaces of the first electrical connecting portions 24. The LED chips 30 can be made of a material selected from a group consisting of GaN, InGaN, AlInGaN, and GaP. Each LED chip 30 is secured to a corresponding first electrical connecting portion 24 by gluing of adhesive, and is electrically connected to the corresponding first electrical connecting portion 24 and second electrical connecting portion 25 by wire bonding of gold wires 40.

Figure 6:
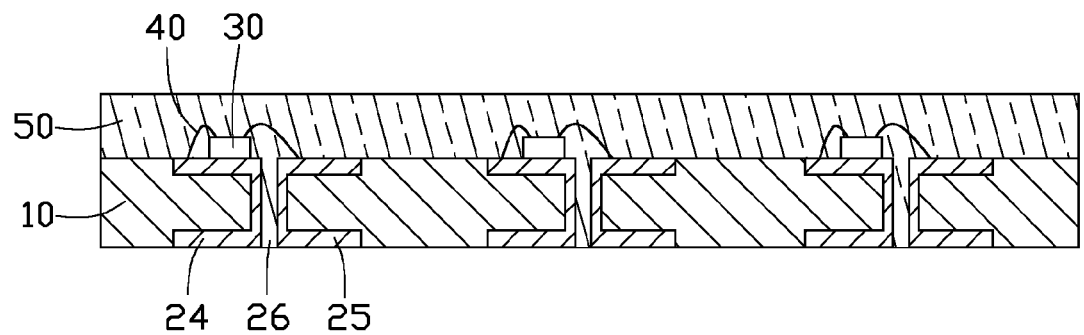
FIG. 6 is a view similar FIG. 2, showing the semi-finished product obtained after a fifth step of the method in FIG. 1.

Referring to FIG. 6, then an encapsulation 50 is formed on the substrate 10 and encapsulating all of the LED chips 30 and the gold wires 40. The encapsulation 50 is made of transparent materials such as epoxy resin, polycarbonate (PC) and polymethyl methacrylate (PMMA). The encapsulation 50 is doped with phosphors (not shown), thereto change the color of light emitted by the LED chip 30. The phosphors can be made of garnets, silicates, nitrides or nitrogen oxides. The encapsulation 50 covers the upper surface of the substrate 10, the upper surfaces of the first electrical connecting portions 24 and the upper surfaces of the second electrical connecting portions 25 and fills in the gaps 26, thereto isolate the LED chips 30 from the external environment. The gaps 26 can be fully filled with the encapsulation 50, or be partly filled with the encapsulation 50, whereby the separated parts of the substrate 10 are connected together by the encapsulation 50.

Figure 7:
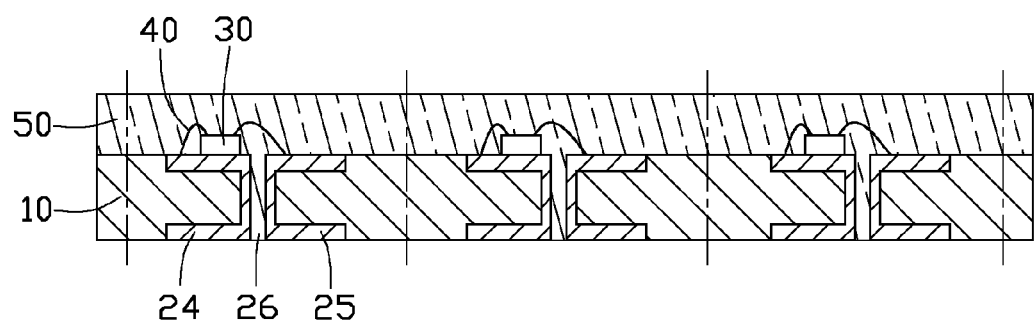
FIG. 7 is a view similar FIG. 2, showing the semi-finished product obtained after a sixth step of the method in FIG. 1.
Figure 8:
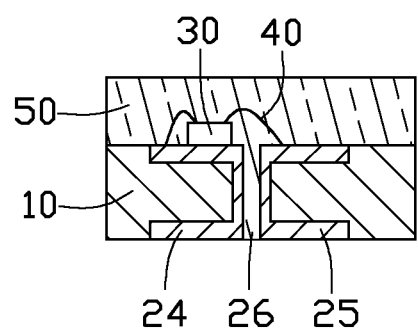
FIG. 8 is a view similar FIG. 2, showing an LED manufactured by the method in FIG. 1.
Figure 9:
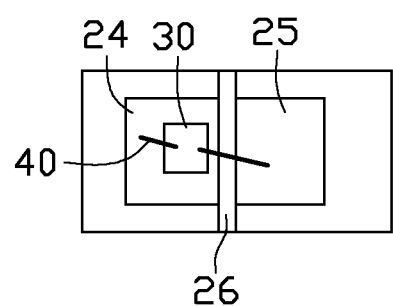
FIG. 9 shows a top view of the LED of FIG. 8.

Finally, referring to FIG. 7, the semi-finished product is severed along paths between the first electrical connecting portion 24 and the second electrical connecting portion 25 of neighboring circuit structures 20 through the substrate 10 and the encapsulation 50 in a direction perpendicular to the substrate 10, thereto form a plurality of individual LEDs as shown in FIGS. 8-9.

As described above, the method for manufacturing the LEDs includes a step of forming circuit structure 20 on the substrate 10. The circuit structure 20 includes the first metal layer 21 formed on the upper surface of the substrate 10, the second metal surface 22 formed on the bottom surface of the substrate 10 and the connecting section 23 extending through the substrate 10 and connecting the first metal layer 21 with the second metal layer 22. Then the circuit structure 20 is cut through along a middle of the connecting section 23 in a direction particular to the substrate 10, thereto form the first electrical connecting portion 24 and the second electrical connecting portion 25 insulated from each other. A gap 26 is formed between adjacent first electrical connecting portion 24 and second electrical connecting portion 25. LED chips 30 are adhered to the first electrical connecting portions 24, respectively, and electrically connected to the first and second electrical connecting portions 24 by wire bonding. Encapsulation 50 is applied on the upper surface of the substrate 10 to encapsulate the LED chips 30 and fill in the gaps 26 to obtain a semi-finished product. Finally, the semi-finished product is severed along paths between the first electrical connecting portions 24 and the second electrical connecting portions 25 between neighboring circuit structures 20 through the encapsulation 50 and the substrate 10 in a direction particular to the substrate 10 to obtain the LEDs. The method for manufacturing the LEDs described above is simple and easy to operate. Thus, the yielding rate of the LEDs is high.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A method for manufacturing LEDs, comprising:
   providing a substrate;
   forming circuit structures on the substrate, each of the circuit structures comprising a first metal layer on an upper surface of the substrate, a second metal layer on an bottom surface of the substrate, and a connecting section extending through the substrate and connecting the first metal layer with the second metal layer;
   cutting through each of the circuit structures along the connecting section thereof to form a first electrical connecting portion and a second electrical connecting portion separated and insulated from each other via a gap therebetween;
   arranging LED chips on the substrate, and electrically connecting each LED chip to the first electrical connecting portion and the second electrical connecting portion of one circuit structure;
   forming an encapsulation on the substrate to cover the LED chips, the encapsulation filling at least a part of the gap to obtain a semi-finished product, the gap being fully filled with the encapsulation, the separated first electrical connecting portion and second electrical connecting portion are connected together by the encapsulation; and
   cutting the semi-finished product through the substrate and the encapsulation along paths between the first electrical connecting portions and the second electrical connecting portions of neighboring circuit structures to form the LEDs;
   wherein the gap is fully filled with the encapsulation.

2. The method as claimed in claim 1, wherein the first metal layer is paralleled to the second metal layer, and the connecting section is particular to the first metal layer and the second metal layer.

3. The method as claimed in claim 1, wherein the circuit structure is formed by insert molding technology.

4. The method as claimed in claim 1, wherein an upper surface of the first metal layer is coplanar with the upper surface of the substrate, and a bottom surface of the second metal layer is coplanar with the bottom surface of the substrate.

5. The method as claimed in claim 1, wherein a width of the gap is not less than 0.1 mm.

6. The method as claimed in claim 1, wherein the LED chips are arranged on the first electrical connecting portions of the circuit structures, respectively.

7. The method as claimed in claim 1, wherein electrodes of each of the LED chips are electrically connected to the first electrical connecting portion and the second electrical connecting portion by wire bonding.

8. The method as claimed in claim 1, wherein the encapsulation covers the upper surface of the substrate, the upper surface of the first electrical connecting portion, the upper surface of the second electrical connecting portion and the gap.

9. The method as claimed in claim 1, wherein the encapsulation is doped with phosphors.

10. The method as claimed in claim 9, wherein the phosphors is made of a material selected from a group consisting of garnets, silicones, nitrides and nitrogen oxides.

11. The method as claimed in claim 1, wherein the encapsulation is made of a material selected from a group consisting of epoxy resin, polycarbonate and polymethyl methacrylate.

* * * * *